US012672538B2

(12) United States Patent
Li et al.

(10) Patent No.: US 12,672,538 B2
(45) Date of Patent: Jun. 30, 2026

(54) METHOD FOR MANUFACTURING SEMICONDUCTOR DEVICE HAVING FUSE COMPONENT

(71) Applicant: NANYA TECHNOLOGY CORPORATION, New Taipei City (TW)

(72) Inventors: Wei-Zhong Li, Taoyuan City (TW); Hsih-Yang Chiu, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 661 days.

(21) Appl. No.: 17/811,067

(22) Filed: Jul. 6, 2022

(65) Prior Publication Data

US 2024/0014127 A1 Jan. 11, 2024

(51) Int. Cl.
*H10W 20/49* (2026.01)
*H10B 20/25* (2023.01)

(52) U.S. Cl.
CPC .......... *H10W 20/491* (2026.01); *H10B 20/25* (2023.02); *H10W 20/493* (2026.01)

(58) Field of Classification Search
CPC . H01L 23/5252; H01L 23/5256; H10B 20/25; H10W 20/491; H10W 20/493
See application file for complete search history.

(56) References Cited

U.S. PATENT DOCUMENTS

| | | |
|---|---|---|
| 5,508,220 A | 4/1996 | Eltoukhy et al. |
| 6,088,256 A | 7/2000 | Worley et al. |
| 9,953,990 B1 * | 4/2018 | Horch ................ H10W 10/014 |
| 2006/0046354 A1 | 3/2006 | Kreipl |
| 2007/0205485 A1 | 9/2007 | Hsu et al. |
| 2010/0230781 A1 | 9/2010 | Booth, Jr. et al. |
| 2015/0200251 A1 | 7/2015 | Chi et al. |
| 2016/0180960 A1 | 6/2016 | Lee |
| 2016/0190145 A1 * | 6/2016 | Maekawa ............. G11C 17/12 |
| | | 257/50 |
| 2016/0336332 A1 * | 11/2016 | Lee ..................... H10W 20/491 |
| 2019/0131238 A1 * | 5/2019 | Chang ................ H10W 20/491 |
| 2019/0295949 A1 | 9/2019 | Reznicek et al. |
| 2020/0343182 A1 * | 10/2020 | Lin ..................... H10W 20/491 |
| 2021/0118797 A1 * | 4/2021 | Hao .................... H10W 20/491 |
| 2021/0249421 A1 * | 8/2021 | Ou ........................ H10B 20/25 |
| 2023/0215803 A1 * | 7/2023 | Wei .................... H10W 20/491 |
| | | 257/530 |

FOREIGN PATENT DOCUMENTS

| | | |
|---|---|---|
| TW | 202207423 A | 2/2022 |
| TW | 202221717 A | 6/2022 |

* cited by examiner

*Primary Examiner* — Fernando L Toledo
*Assistant Examiner* — Marshall Mu-Nuo Hatfield
(74) *Attorney, Agent, or Firm* — MUNCY, GEISSLER, OLDS & LOWE, P.C.

(57) ABSTRACT

A method of manufacturing a semiconductor device is provided. The method includes providing a substrate having an active area and forming a first diffusion area in the active area. The method also includes disposing a nitride layer on the active area and forming an opening in the nitride layer to expose the first diffusion area. The method also includes disposing an oxide layer in the opening to contact the first diffusion area.

8 Claims, 18 Drawing Sheets

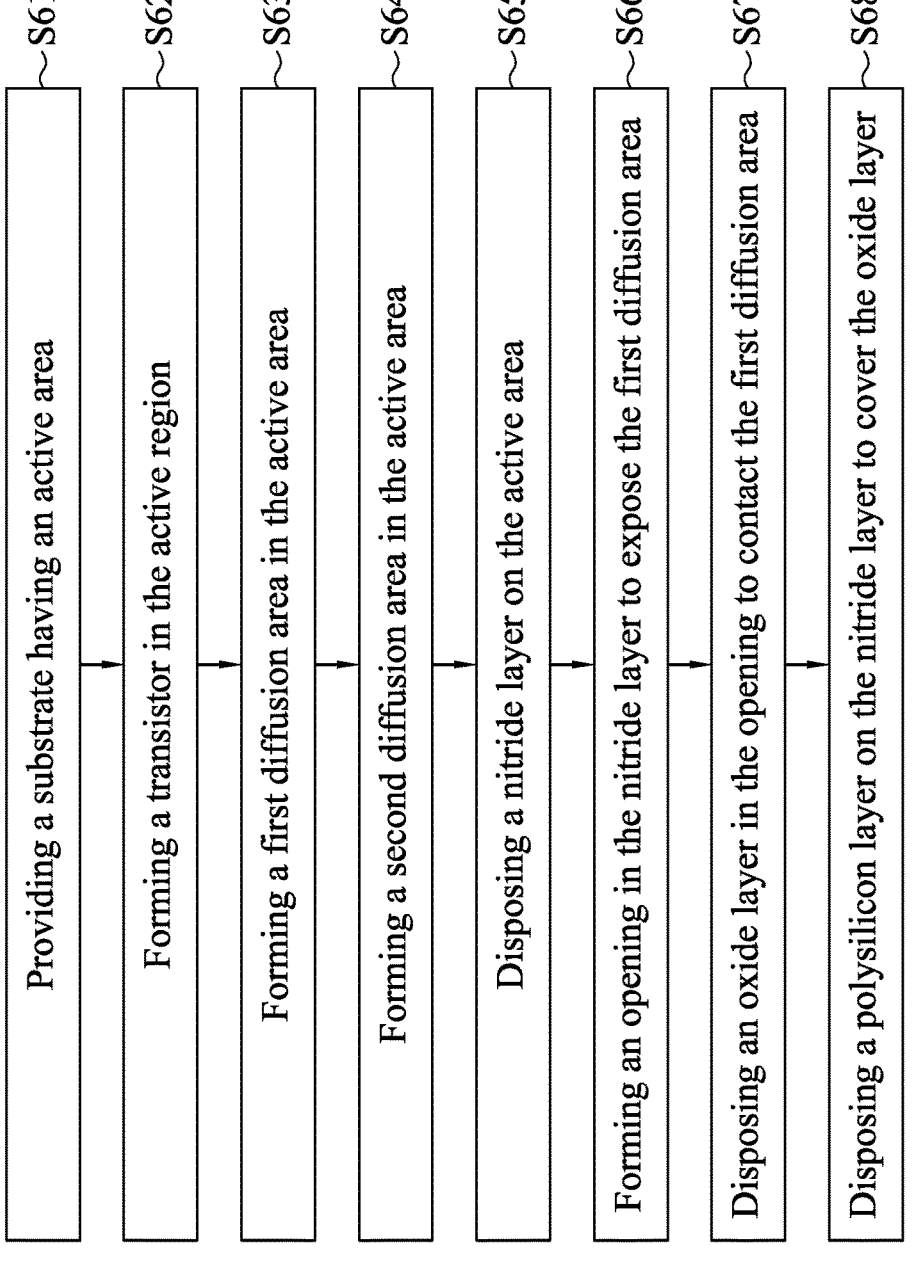

S61 Providing a substrate having an active area

S62 Forming a transistor in the active region

S63 Forming a first diffusion area in the active area

S64 Forming a second diffusion area in the active area

S65 Disposing a nitride layer on the active area

S66 Forming an opening in the nitride layer to expose the first diffusion area

S67 Disposing an oxide layer in the opening to contact the first diffusion area

S68 Disposing a polysilicon layer on the nitride layer to cover the oxide layer

METHOD FOR MANUFACTURING SEMICONDUCTOR DEVICE HAVING FUSE COMPONENT

TECHNICAL FIELD

The present disclosure relates to a method for manufacturing a semiconductor device having a fuse component, and more particularly, to a method for manufacturing a fuse component having a fuse blown area.

DISCUSSION OF THE BACKGROUND

Fuses and anti-fuses are widely used in the fabrication of semiconductor devices, such as dynamic random-access memory (DRAM) or other memory devices for fault tolerance, or used as programmable links in programmable circuits. For example, a circuit path that is initially conductive can be broken or cut off by activating (e.g., blowing, melting, etc.) a fuse. Conversely, a non-conductive circuit path may become a short circuit by activating (e.g., through unblowing, breakdown, metal diffusion, transformation of properties, etc.) an anti-fuse.

However, fuses and anti-fuses may occupy a large area. As semiconductor devices become more highly integrated, fuses and anti-fuses with favorable size and breakdown conditions are required.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate having an active area and a fuse component. The fuse component has a bottom electrode in the active area, a first dielectric layer on the active area and a top electrode on the first dielectric layer. The semiconductor device also includes a second dielectric layer on the active area and surrounding the first dielectric layer.

Another aspect of the present disclosure provides a semiconductor device. The semiconductor device includes a substrate having an active area and a first diffusion area adjacent to a surface of the active area. The semiconductor device also includes a nitride layer on the active area and defines a first fuse blown area above the first diffusion area.

Another aspect of the present disclosure provides a method of manufacturing a semiconductor device. The method includes providing a substrate having an active area and forming a first diffusion area in the active area. The method also includes disposing a nitride layer on the active area and forming an opening in the nitride layer to expose the first diffusion area. The method also includes disposing an oxide layer in the opening to contact the first diffusion area.

By using a nitride layer to define a fuse blown area, the oxide breakdown area of the fuse component of the present disclosure is reduced and the probability of successfully fusing the fuse components is increased. In addition, since the oxide breakdown location of the fuse component of the present disclosure is spaced apart from the transistor, the drain-gate (D-G) short probability is reduced.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 6 illustrates a flow chart of a method of manufacturing a semiconductor device in accordance with some embodiments of the present disclosure.

DETAILED DESCRIPTION

Figure 1A:
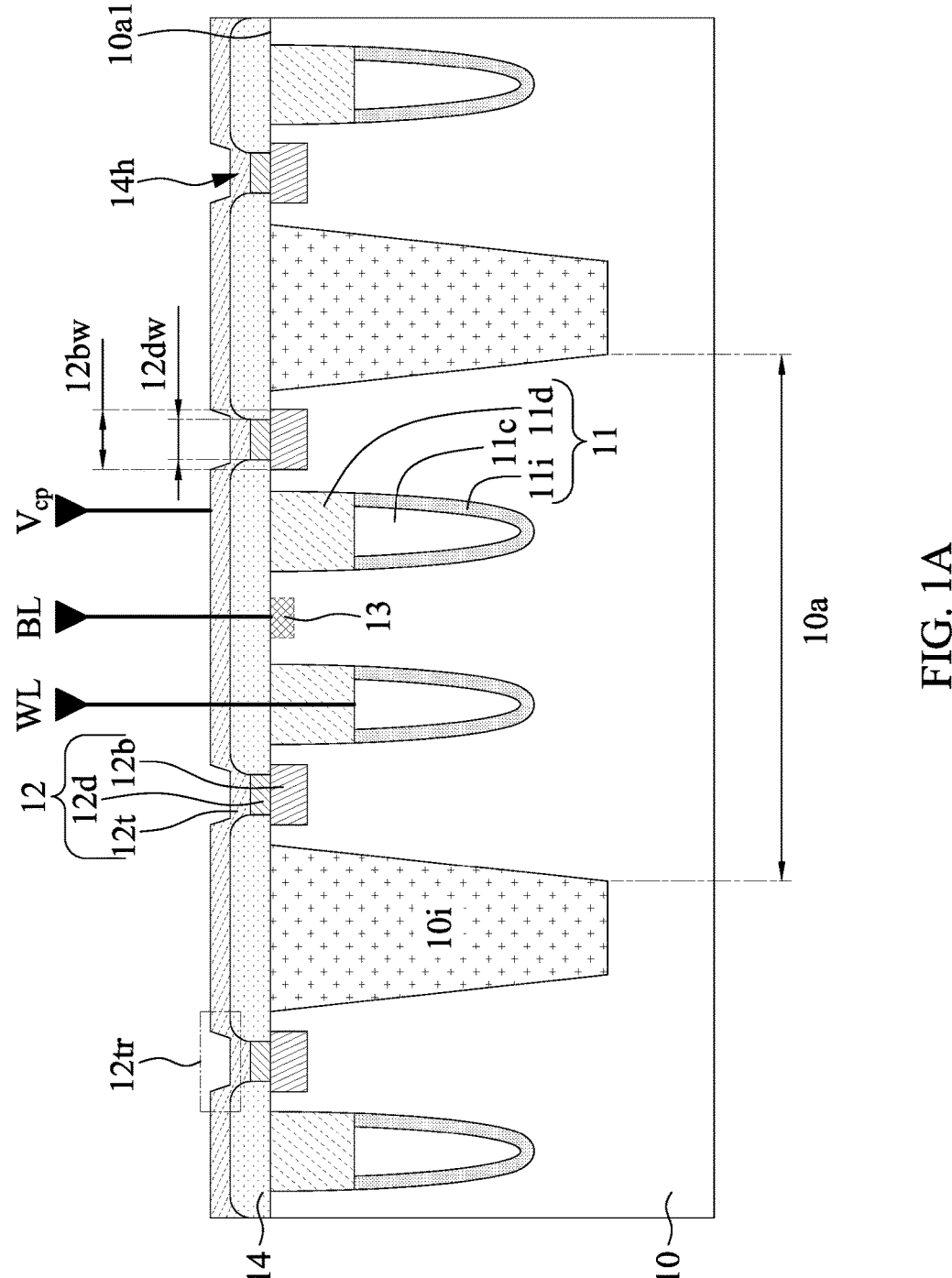
FIG. 1A is a schematic cross-sectional view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A is a schematic cross-sectional view of a semiconductor device 1 in accordance with some embodiments of the present disclosure.

In some embodiments, the semiconductor device 1 may be disposed adjacent to a main device. In some embodiments, the main device may include a volatile memory device or a nonvolatile memory device, such as a dynamic random-access memory (DRAM), an electrically erasable programmable read-only memory (EEPROM), a flash memory, etc. In some embodiments, the semiconductor device 1 may be disposed adjacent to a circuit, such as an analog circuit, a digital circuit, a radio frequency (RF) circuit, a logic operation circuit, or a combined circuit including more than one of these circuits.

In some embodiments, the semiconductor device 1 may be configured to repair the main device. In some embodiments, the semiconductor device 1 may be configured to trim or adjust an operation voltage or an operation frequency in the main device. In some embodiments, the semiconductor device 1 may include a permanent storage, such as a one-time-programmable (OTP) memory device. In some embodiments, the semiconductor device 1 may be configured to store programs, boot codes (e.g., instructions are run by a computer or an electronic device at start up), device identification information, and/or other information to be fixed in value.

In some embodiments, the semiconductor device 1 may include a fuse-array to ensure that bits of the semiconductor device 1 remain fixed (e.g., cannot be altered). The fixing of bits of the semiconductor device 1 may be accomplished via activating (e.g., blowing, melting, etc.) a fuse or activating (e.g., through unblowing, breakdown, metal diffusion, transformation of properties, etc.) an anti-fuse, depending on the fuse type of the semiconductor device 1 utilized.

For example, when a fuse is utilized, it is initially in an unblown state characterized by a relatively low resistance. Application of a high current (e.g., above a predetermined level) causes a permanent transition of the fuse to a blown state characterized by a relatively high resistance (i.e., effectively generating an open circuit). Conversely, when an anti-fuse is utilized, it is initially in a blown state and application of a high voltage (e.g., above a predetermined level) causes a permanent transition of the anti-fuse to an unblown state characterized by a relatively low resistance (i.e., effectively generating a closed circuit). In some embodiments, a blown state may correspond to a logical low value (e.g., 0) and an unblown state may correspond to a logical high value (e.g., 1), or vice versa.

As used herein, the term "fuse component" encompasses a fuse or an anti-fuse. The fuse refers to a component having binary states and is alterable from a conductive state to a non-conductive state (or is alterable from a low resistance to a high resistance) in response to electric stress, such as a programming voltage or current. The anti-fuse refers to a component having binary states and is alterable from a non-conductive state to a conductive state (or is alterable from a high resistance to a low resistance) in response to electric stress, such as a programming voltage or current. Although an anti-fuse is described in the following descriptions as an example, the present disclosure is not limited thereto.

As shown in FIG. 1A, in some embodiments, the semiconductor device 1 may include a substrate 10, one or more transistors 11, one or more fuse components 12, a diffusion area 13, and a dielectric layer 14.

The substrate 10 may include a semiconductor substrate. In some embodiments, the substrate 10 may include, for example, silicon (Si), monocrystalline silicon, polysilicon, amorphous silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the substrate 10 may include a layered semiconductor such as silicon/silicon germanium, silicon-on-insulator, or silicon germanium-on-insulator.

The substrate 10 may include one or more isolation structures 10*i* and one or more active areas 10*a*. The isolation structures 10*i* may be disposed between the active areas 10*a* to isolate the active areas 10*a*. The active areas 10*a* may be defined by the isolation structures 10*i*.

In some embodiments, the isolation structures 10*i* may be disposed over or in the substrate 10. In some embodiments, the isolation structures 10*i* may be disposed in the active area 10a. In some embodiments, the isolation structures 10i may include shallow trench isolation (STI) structures.

In some embodiments, the isolation structures 10i may each include an insulating material such as silicon oxide (SiO$_2$), silicon nitride (Si$_3$N$_4$), silicon oxynitride (N$_2$OSi$_2$), silicon nitride oxide (N$_2$OSi$_2$), or fluorine-doped silica.

In some embodiments, the active area 10a may be disposed over or in the substrate 10. In some embodiments, the active area 10a may be disposed over or proximal to a top surface of the substrate 10. In some embodiments, the active area 10a may have a surface (or a top surface) 10a1 exposed from the top surface of the substrate 10. In some embodiments, the surface 10a1 of the active area 10a may be substantially coplanar with the top surface of the substrate 10. In some embodiments, the active area 10a may be disposed between two isolation structures 10i. For example, a part of the active area 10a may be disposed between the two isolation structures 10i.

In some embodiments, the active area 10a may be doped with an N-type dopant such as phosphorus (P), arsenic (As), or antimony (Sb). In some other embodiments, the doped area 10a may be doped with a P-type dopant such as boron (B) or indium (In). In some embodiments, the substrate 10 may be or include an unimplanted area. In some embodiments, the active area 10a may have a higher doping concentration than the substrate 10.

In some embodiments, the active area 10a may include a substantially constant doping concentration. In some embodiments, the active area 10a may include a step, gradient, or other doping profile. For example, the active area 10a may include a gradually changing doping concentration.

The transistor 11 may be disposed over or in the active area 10a. The transistor 11 may include a buried transistor. The transistor 11 may be disposed in a trench that runs through one of the active areas 10a. The transistor 11 may include an insulating liner 11i, a conductor 11c and a dielectric layer 11d.

The conductor 11c may be the gate of the transistor 11. In some embodiments, the diffusion area 13 and a bottom electrode 12b may be source/drain of the transistor 11. A word-line WL may be connected to the conductor 11c to turn it on. A bit-line BL may be connected to the diffusion area 13 to apply a voltage to the bottom electrode 12b through the transistor 11.

The insulating liner 11i may be conformally formed on the bottom surface and sidewall of the trench. The insulating liner 11i may surround or cover a part of the conductor 11c. The insulating liner 11i may separate the conductor 11c from the substrate 10. The insulating liner 11i may be disposed between the conductor 11c and the substrate 10.

In some embodiments, the insulating liner 11i may include, for example, silicon oxide (SiO$_2$), silicon nitride (Si$_3$N$_4$), silicon oxynitride (N$_2$OSi$_2$), silicon nitride oxide (N$_2$OSi$_2$), a high-k material or combinations thereof. Examples of the high-k material include a dielectric material having a dielectric constant that is higher than that of silicon dioxide (SiO$_2$), or a dielectric material having a dielectric constant higher than about 3.9. In some embodiments, the insulating liner 11i may include at least one metallic element, such as hafnium oxide (HfO$_2$), silicon doped hafnium oxide (HSO), lanthanum oxide (La$_2$O$_3$), lanthanum aluminum oxide (LaAlO$_3$), zirconium oxide (ZrO$_2$), zirconium orthosilicate (ZrSiO$_4$), aluminum oxide (Al$_2$O$_3$) or combinations thereof.

The conductor 11c may include a buried conductor. The conductor 11c may be disposed on the insulating liner 11i and spaced apart from the substrate 10 by the insulating liner 11i.

In some embodiments, the conductor 11c may include a single layer of metal, metal composite or layers of conductive materials. In some embodiments, the conductor 11c may include a metal-based material. For example, the conductor 11c may include titanium (Ti), titanium nitride (TiN), titanium silicon nitride (TiSiN), tantalum (Ta), tantalum nitride (TaN), tantalum silicon nitride (TaSiN), tungsten (W), tungsten nitride (WN), tungsten silicon nitride (WSiN), a stack thereof or a combination thereof.

The dielectric layer 11d may be disposed on the conductor 11c. The dielectric layer 11d may serve to protect the conductor 11c. The dielectric layer 11d may have a surface substantially coplanar with the surface 10a1 of the active area 10a.

In some embodiments, the dielectric layer 11d may include a dielectric material, such as silicon oxide (SiO$_2$), silicon nitride (Si$_3$N$_4$), silicon oxynitride (N$_2$OSi$_2$), and silicon nitride oxide (N$_2$OSi$_2$), tantalum pentoxide (Ta$_2$O$_5$), aluminum oxide (Al$_2$O$_3$), strontium bismuth tantalum oxide (SrBi$_2$Ta$_2$O$_9$, SBT), barium strontium titanate oxide (BaSrTiO$_3$, BST), or a combination thereof. In some embodiments, the dielectric layer 11d may include a silicon nitride liner and a spin-on-dielectric (SOD) material.

The fuse component 12 may be disposed adjacent to the transistor 11. The fuse component 12 may include a capacitor used as an anti-fuse. The fuse component 12 may include a capacitor function as an anti-fuse. The capacitor may include a planar capacitor or a metal oxide semiconductor (MOS) capacitor.

However, in some other embodiments, the fuse component 12 may include a metal-oxide-semiconductor field-effect transistor (MOSFET), a poly-fuse or any OTP memory element.

The fuse component 12 may include a bottom electrode 12b, a top electrode 12t and a dielectric layer 12d between the bottom electrode 12b and the top electrode 12t.

The bottom electrode 12b may also be referred to as a bottom node or a bottom plate. In some other embodiments, the bottom electrode 12b may include, but is not limited to, a bowl-shaped profile, a U-shaped profile, or another feasible profile.

The bottom electrode 12b may include a diffusion area or a doped area. In some embodiments, the diffusion area may be doped with an N-type dopant such as phosphorus (P), arsenic (As), or antimony (Sb). In some embodiments, the diffusion area may be doped with a P-type dopant such as boron (B) or indium (In). In some embodiments, a lightly doped diffusion (LDD) area may be disposed between the bottom electrode 12b and an edge of the transistor 11.

The dielectric layer 12d may include an active area of the fuse component 12. For example, the dielectric layer 12d may include a fuse blown area. The fuse blown area may be a region where oxide breakdown can occur. In some embodiments, a dimension (e.g., a thickness, a width or a surface area) of the dielectric layer 12d may determine a breakdown voltage of the fuse component 12.

In some embodiments, the dielectric layer 12d may include oxide, nitride or oxynitride. In some embodiments, the dielectric layer 12d may include hafnium oxide (HfO$_2$), hafnium silicate (HfSiO$_4$), lanthanum oxide (La$_2$O$_3$), lanthanum aluminum oxide (LaAlO$_3$), zirconium oxide (ZrO$_2$), zirconium silicate (ZrSiO$_4$), aluminum oxide (Al$_2$O$_3$), other high-k materials, or a combination thereof.

The top electrode 12t may also be referred to as a top node or a top plate. In some embodiments, the top electrode 12t may include, for example, a polysilicon layer or a polysilicon strip.

In some embodiments, the fuse components 12 may include a fuse array including a plurality of fuse-array elements. In some embodiments, a node (such as the bottom electrode 12b) of each fuse-array element is connected with a transistor. The opposite nodes (such as the top electrodes 12t) of the fuse-array elements are connected together.

For example, the top electrode 12t may extend between two fuse components 12. For example, the top electrode 12t may connect with a plurality of dielectric layers 12d. For example, the top electrode 12t may connect with a plurality of fuse blown areas.

In some embodiments, a voltage $V_{cp}$ (e.g., a pumped voltage, a programming power voltage, a bias voltage, etc.) may be connected to the top electrode 12t to program the fuse components 12.

The diffusion area 13 may be doped with an N-type dopant such as phosphorus (P), arsenic (As), or antimony (Sb). In some embodiments, the diffusion area 13 may be doped with a P-type dopant such as boron (B) or indium (In). In some embodiments, a lightly doped diffusion (LDD) area may be disposed between the diffusion area 13 and an edge of the transistor 11. In some other embodiments, the diffusion area 13 may include, but is not limited to, a bowl-shaped profile, a U-shaped profile, or another feasible profile.

In some embodiments, the diffusion area 13 and the bottom electrode 12b may be doped with dopants or impurity ions having the same conductivity types. In some embodiments, the diffusion area 13 and the bottom electrode 12b may be doped with dopants or impurity ions having different conductivity types.

In some embodiments, the diffusion area 13 and the bottom electrode 12b may be referred to as source/drain regions. In some embodiments, the diffusion area 13 and the bottom electrode 12b may be disposed on opposite sides of the transistor 11.

In some embodiments, the transistor 11 may function as an access transistor for activating the fuse component 12. For example, the transistor 11 may be configured to connect to the bottom electrode 12b. For example, the transistor 11 may be configured to couple a voltage from the diffusion area 13 to the bottom electrode 12b.

In some embodiments, each fuse-array element of the semiconductor device 1 may include a fuse component and an access transistor.

In some embodiments, the transistor 11 may be controlled by the bit-line BL and the word-line WL. The bit-line BL may be coupled to the diffusion area 13 and the word-line WL may be coupled to the conductor 11c of the transistor 11.

In some embodiments, the top electrode 12t may be connected or coupled to the voltage $V_{cp}$. In some embodiments, the bottom electrode 12b may be grounded or held at the substrate potential. In some embodiments, when the voltage exceeds a threshold value (e.g., a breakdown voltage), the fuse component 12 may be activated.

Alternatively, the top electrode 12t may be grounded or held at the substrate potential. The bottom electrode 12b may be connected or coupled to a voltage exceeding the threshold value to activate the fuse component 12.

In some embodiments, a conductive path across the dielectric layer 12d may be formed, thereby causing an open circuit in the semiconductor device 1 to become a short circuit or a relatively low resistance link or node.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

In some embodiments, the dielectric layer 12d may undergo a dielectric breakdown process or a transformation of properties after the breakdown voltage is applied between the top electrode 12t and the bottom electrode 12b. In some embodiments, the dielectric layer 12d may be damaged. In some embodiments, the lattice structure of the dielectric layer 12d may be changed. In some embodiments, a defect may be formed in the dielectric layer 12d. In some embodiments, top electrode 12t and the bottom electrode 12b may be electrically connected through the dielectric layer 12d. In some embodiments, the conductivity of the dielectric layer 12d may be increased by about 1000 times, by about 10000 times, or more after the breakdown voltage is applied between top electrode 12t and the bottom electrode 12b. In some embodiments, the resistivity of the dielectric layer 12d may be decreased after the breakdown voltage is applied between top electrode 12t and the bottom electrode 12b. It will be understood that the conductive path across the dielectric layer 12d may not be observed when the breakdown voltage is applied.

The dielectric layer 14 may be disposed on the substrate 10 and surrounding the dielectric layer 12d. The dielectric layer 14 may include, for example, silicon nitride ($Si_3N_4$) or other nitrides different from the material of the dielectric layer 12d.

The dielectric layer 14 may be configured to define the fuse blown area (e.g., the region where oxide breakdown can occur). The dielectric layer 14 may define an edge where oxide breakdown is prevented.

In some embodiments, when the breakdown voltage is applied between the top electrode 12t and the bottom electrode 12b and the dielectric layer 12d undergoes a dielectric breakdown process, the dielectric layer 14 may remain unchanged.

In some embodiments, a thickness of the dielectric layer 14 may be greater than a thickness of the dielectric layer 12d along a direction substantially perpendicular to the surface 10a1 of the active area 10a. In some embodiments, a ratio of the thickness of the dielectric layer 14 to the thickness of the dielectric layer 12d may be from about 1.0 to 2.0 or higher.

In some embodiments, an edge of the dielectric layer 14 may be rounded. The dielectric layer 14 may include a rounded corner adjacent to a surface thereof facing away from the substrate 10.

In some embodiments, the dielectric layer 14 may define an opening 14h exposing a part of the bottom electrode 12b. The dielectric layer 14 may be disposed on the top surface of the bottom electrode 12b. The dielectric layer 14 may contact the periphery of the top surface of the bottom electrode 12b. A part of the bottom electrode 12b may be covered by the dielectric layer 14 while a part of the bottom electrode 12b may be covered by the dielectric layer 12d.

In some embodiments, a width 12bw of the bottom electrode 12b may be greater than a width 12dw of the dielectric layer 12d. In other words, the width 12dw of the dielectric layer 12d may be less than the width 12bw of the bottom electrode 12b.

In some embodiments, the dielectric layer 14 may define a plurality of openings 14h, each exposing a part of the bottom electrodes 12b. In some embodiments, the dielectric layer 14 may continuously extend among the plurality of openings 14h. For example, the dielectric layer 14 may connect a plurality of dielectric layers 12d with one another.

The top electrode 12t may define a recessing portion 12tr over the opening 14h of the dielectric layer 14. The recessing portion 12tr may also be disposed over the dielectric layer 12d and the bottom electrode 12b. For example, the recessing portion 12tr, the dielectric layer 12d and the bottom electrode 12b may overlap along a direction substantially perpendicular to the surface 10a1 of the active area 10a.

In some embodiments, the top electrode 12t may define a plurality of recessing portions 12tr, each being over an opening 14h of the dielectric layer 14.

In a comparative embodiment, the fuse dielectric layer (e.g., the fuse blown area) may occupy a larger area on the semiconductor substrate. As semiconductor devices become more highly integrated, fuse components with favorable size and breakdown conditions are required.

According to some embodiments of the present disclosure, by using a nitride layer to define a fuse blown area, the oxide breakdown area of the fuse component of the present disclosure is reduced and the probability of successfully fusing the fuse components is increased. In addition, since the oxide breakdown location of the fuse component of the present disclosure is spaced apart from the transistor, the drain-gate (D-G) short probability is reduced.

Figure 1B:
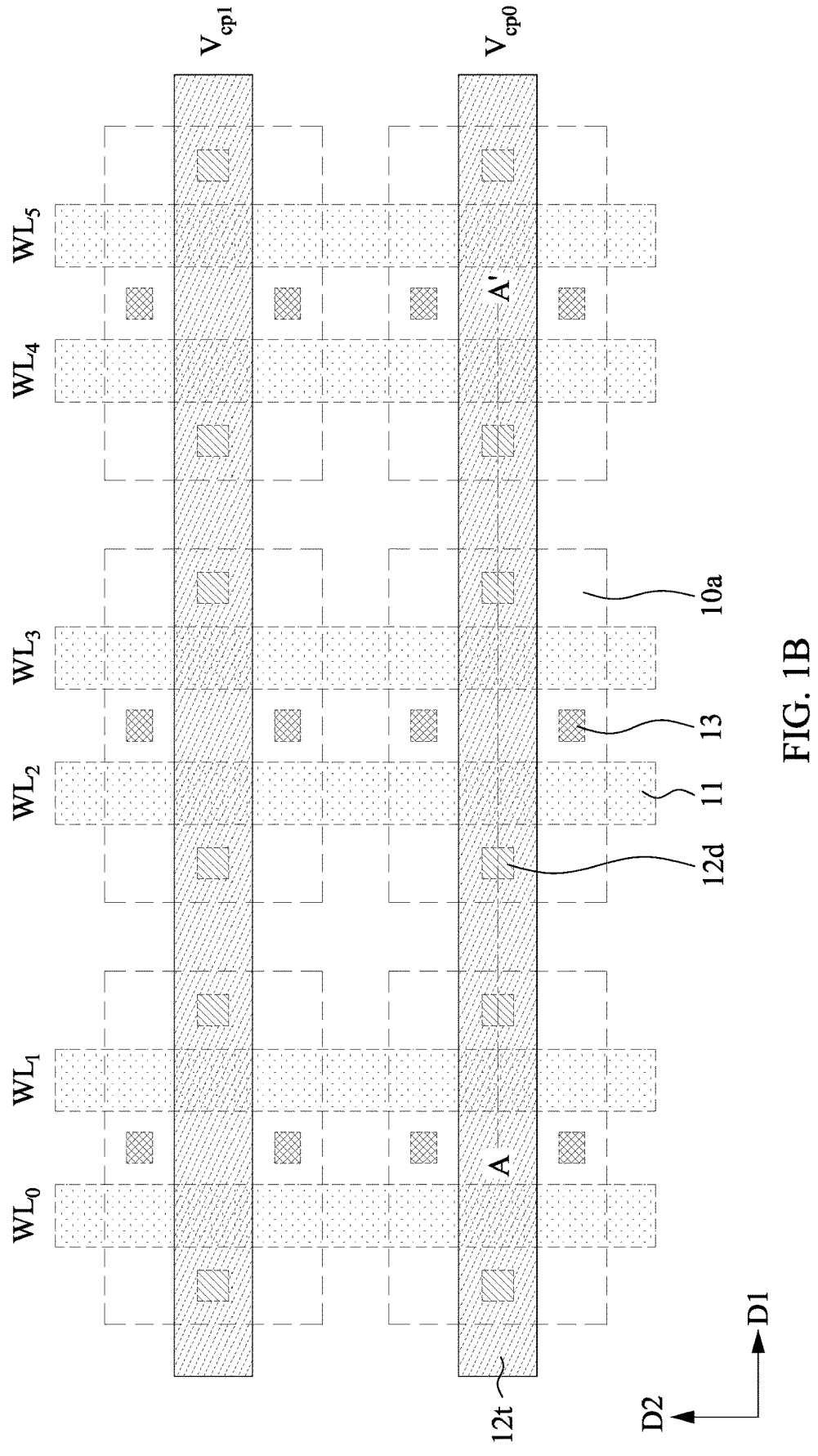
FIG. 1B is a schematic top view of a semiconductor device in accordance with some embodiments of the present disclosure.

FIG. 1B illustrates a schematic top view of a semiconductor device in accordance with some embodiments of the present disclosure. In some embodiments, the semiconductor device 1 of FIG. 1A may be a schematic cross-sectional view cutting through line AA' in FIG. 1B.

As shown in FIG. 1B, the semiconductor device may include a plurality of active areas 10a separated from one another by the isolation structures (not shown in FIG. 1B, such as the isolation structures 10i in FIG. 1A).

The top electrodes 12t may each be formed as a strip-like configuration extending over the substrate (not shown in FIG. 1B, such as the substrate 10 in FIG. 1A) along a first direction, such as the direction D1 shown in FIG. 1B. The top electrodes 12t may each be formed as a continuous polysilicon line. The top electrodes 12t may each run through the active areas 10a. The top electrodes 12t may each be coupled to a voltage to program the fuse components, such as the voltages $V_{cp0}$ and $V_{cp1}$.

The transistors 11 may each have a line shape extending along a second direction, such as the direction D2 shown in FIG. 1B. The transistors 11 may each include a buried conductor buried in a trench that runs through the active areas 10a. The transistors 11 may each be coupled to a word-line (such as the word-lines $WL_0$, $WL_1$, $WL_2$, $WL_3$, $WL_4$ and $WL_5$) to turn on the transistors 11.

Each active area 10a may cross two transistors 11 and may be divided into three diffusion areas by the two transistors 11. For example, the active areas 10a may be divided into a first diffusion area (where the diffusion areas 13 are located) disposed between the two transistors 11 and second diffusion areas (where the dielectric layers 12d or the oxide breakdown areas are located) located at two sides of the first diffusion area. It is to be noted that the diffusion areas 13 may not be aligned with the dielectric layers 12d along the line AA'. Therefore, the diffusion area 13 in FIG. 1A is illustrated with dashed lines.

In some embodiments, the top electrodes 12t may each be intersected with the transistors 11 at an angle of about 90 degrees. In some embodiments, the active areas 10a may each be intersected with the transistors 11 at an angle of about 90 degrees.

As described, the word-lines $WL_0$, $WL_1$, $WL_2$, $WL_3$, $WL_4$ and $WL_5$ may be connected to the conductors (such as the connector 11c in FIG. 1A) of the transistors 11 to turn it on. The diffusion areas 13 may receive a voltage (such as from the bit-line BL in FIG. 1A), which may be coupled to a node or an electrode (such as the bottom electrode 12b in FIG. 1A) through the transistors 11. The voltages $V_{cp0}$ and $V_{cp1}$ (e.g., a pumped voltage, a programming power voltage, a bias voltage, etc.) may be connected to the top electrodes 12t.

Figure 1C:
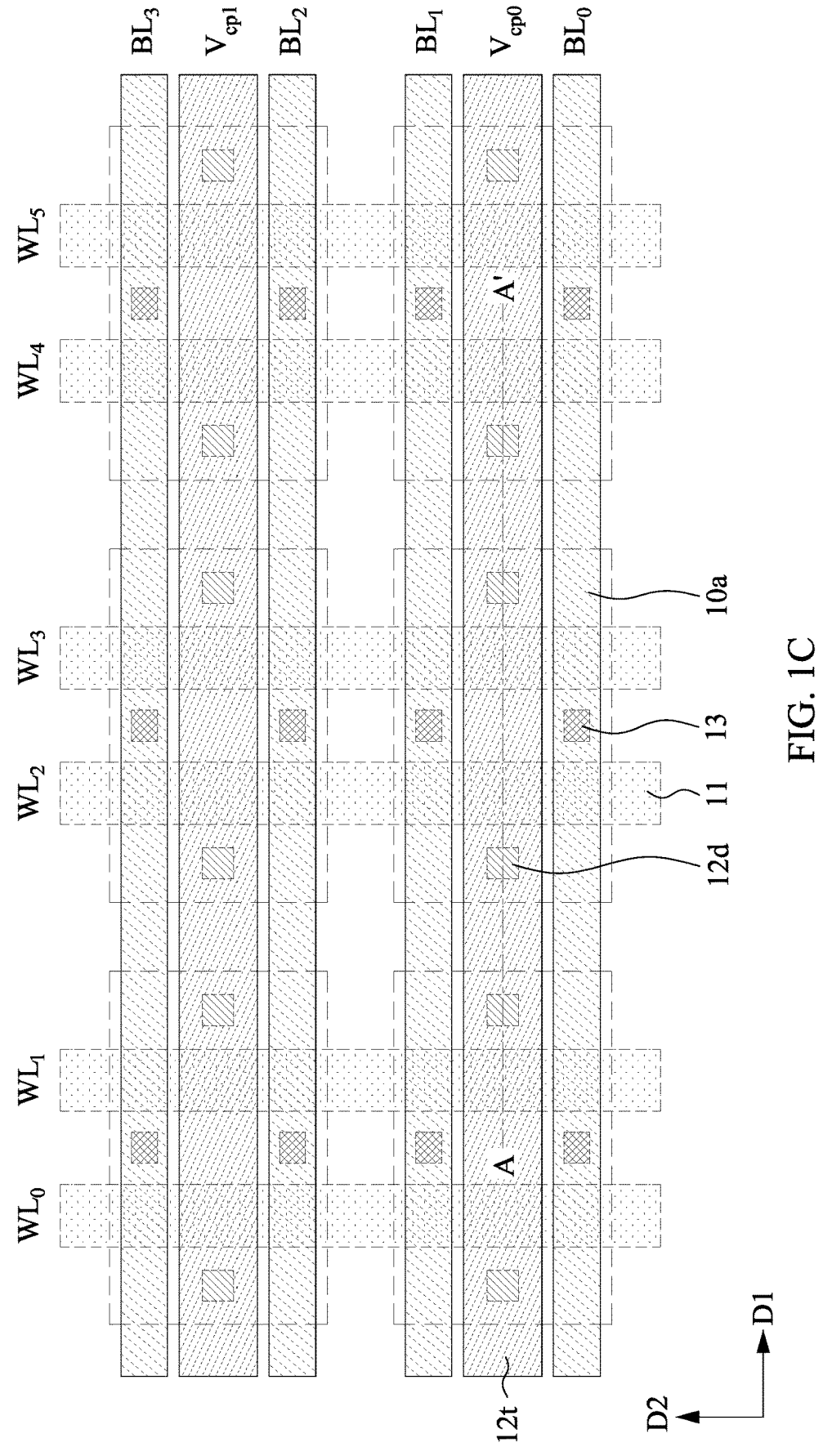
FIG. 1C is a schematic top view of a semiconductor device in accordance with some embodiments of the present disclosure.

FIG. 1C illustrates a schematic top view of a semiconductor device in accordance with some embodiments of the present disclosure. In some embodiments, the semiconductor device 1 of FIG. 1A may be a schematic cross-sectional view cutting through line AA' in FIG. 1C.

The semiconductor device of FIG. 1C is similar to the semiconductor device of FIG. 1B, except for the differences described below.

The diffusion areas 13 may include bit-line contacts and may each be coupled to a bit-line (such as the bit-lines $BL_0$, $BL_1$, $BL_2$ and $BL_3$). In some embodiments, the bit-lines $BL_0$, $BL_1$, $BL_2$ and $BL_3$ may each be intersected with the transistors 11 at an angle of about 90 degrees.

Figure 2:
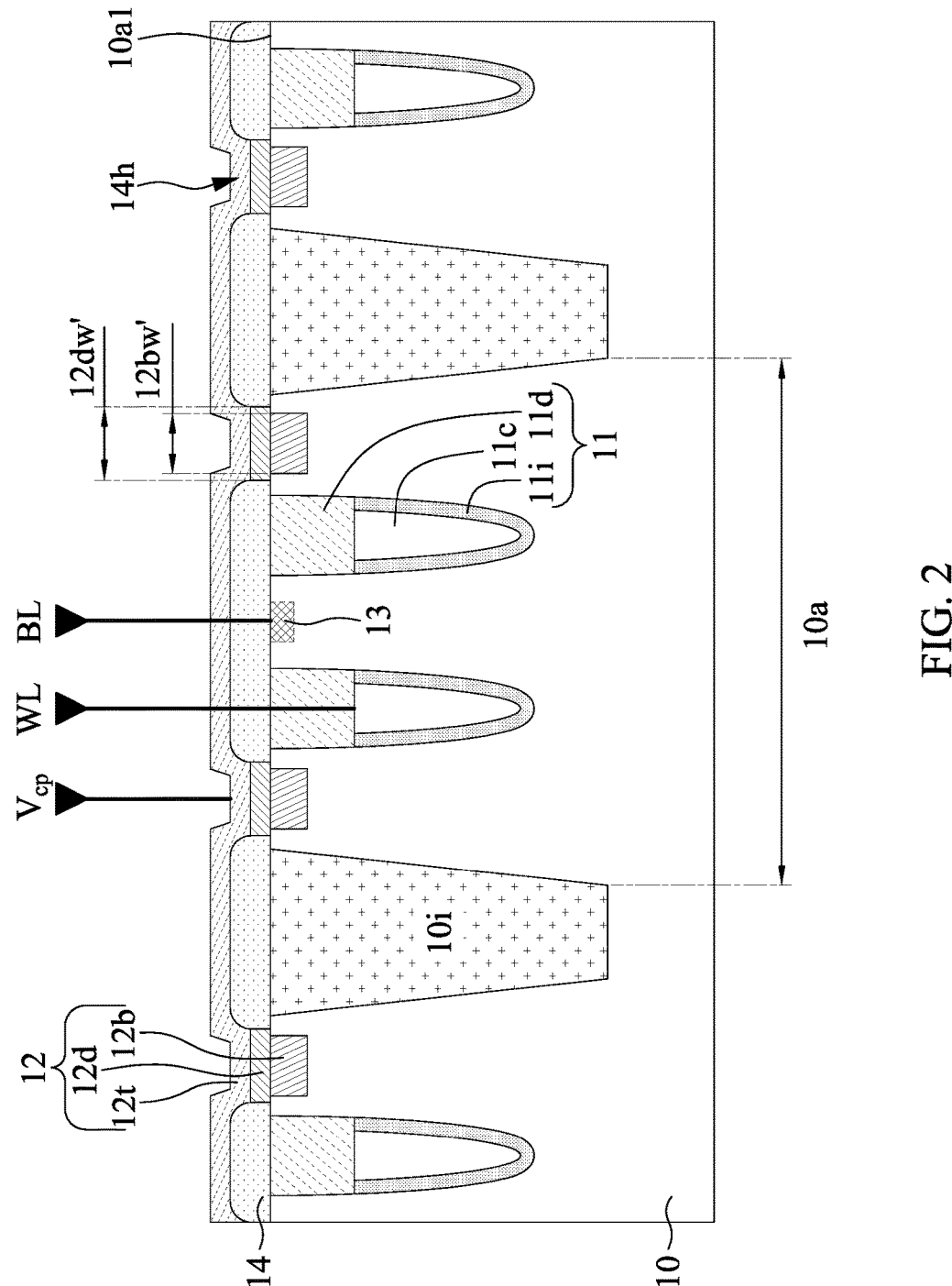
FIG. 2 is a schematic cross-sectional view of a semiconductor device in accordance with some embodiments of the present disclosure.

FIG. 2 is a schematic cross-sectional view of a semiconductor device 2 in accordance with some embodiments of the present disclosure. The semiconductor device 2 of FIG. 2 is similar to the semiconductor device 1 of FIG. 1A, except for the differences described below.

In some embodiments, the dielectric layer 14 may define an opening 14h exposing the bottom electrode 12b. The dielectric layer 14 may be spaced apart from the top surface of the bottom electrode 12b. The dielectric layer 14 may not contact the top surface of the bottom electrode 12b. An edge of the dielectric layer 14 may be spaced apart from the bottom electrode 12b. The bottom electrode 12b may be entirely covered by the dielectric layer 12d.

In some embodiments, a width 12bw' of the bottom electrode 12b may be less than a width 12dw' of the dielectric layer 12d. In other words, the width 12dw' of the dielectric layer 12d may be greater than the width 12bw' of the bottom electrode 12b.

Figure 3:
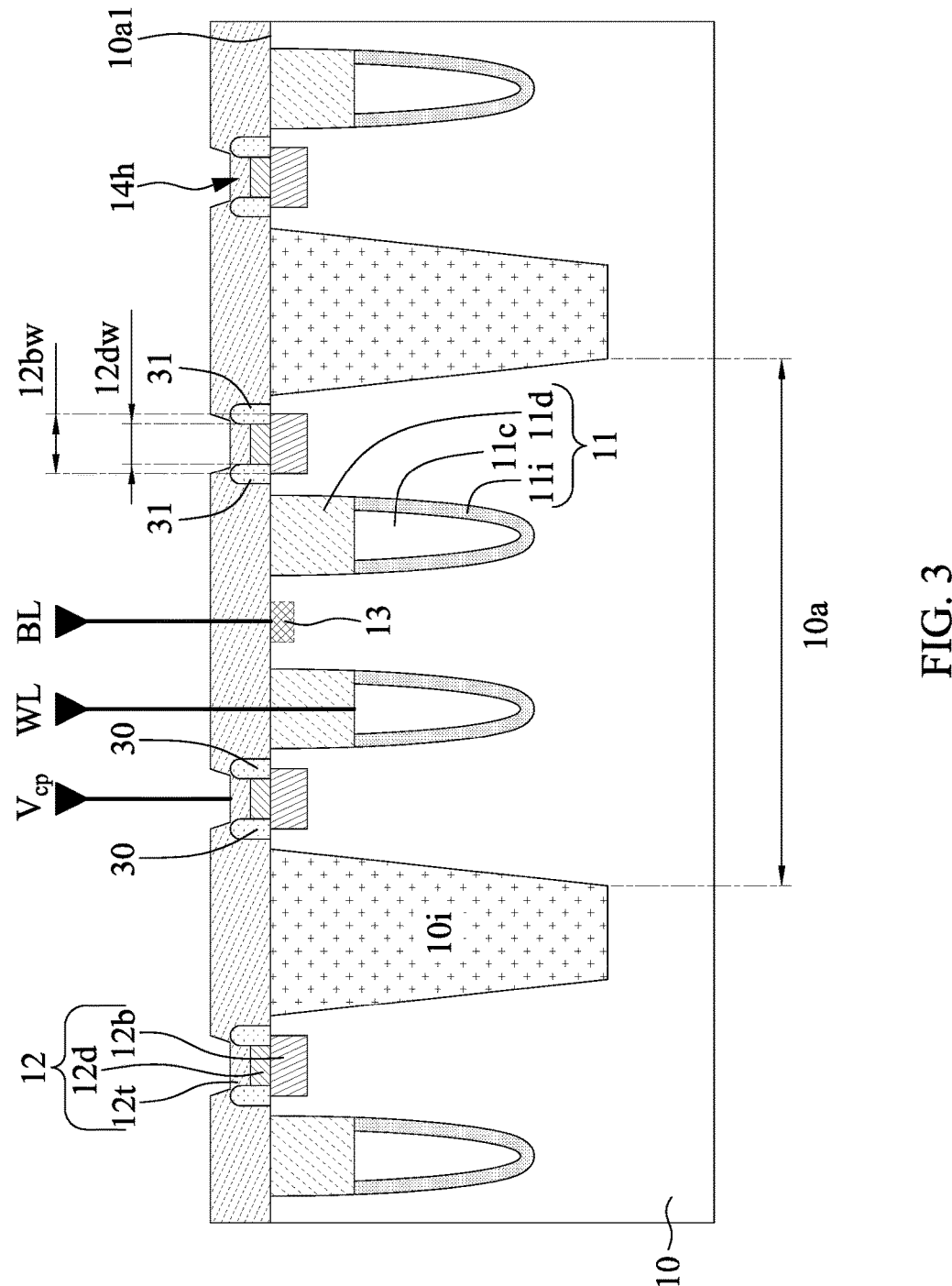
FIG. 3 illustrates a schematic top view of a semiconductor device in accordance with some embodiments of the present disclosure.

FIG. 3 is a schematic cross-sectional view of a semiconductor device 3 in accordance with some embodiments of the present disclosure. The semiconductor device 3 of FIG. 3 is similar to the semiconductor device 1 of FIG. 1A, except for the differences described below.

In some embodiments, the dielectric layer 14 may include a plurality of portions, each of which may define an opening 14h to expose a part of the bottom electrodes 12b. The portions of the dielectric layer 14 may be spaced apart from one another. For example, the dielectric layer 14 may not continuously extend among the plurality of openings 14h. For example, the dielectric layer 14 may not connect a plurality of dielectric layers 12d with one another.

For example, the dielectric layer 14 may include a portion 30 defining a fuse blown area over one bottom electrode 12b and a portion 31 defining a fuse blown area over another bottom electrode 12b. The portion 30 and the portion 31 may be spaced apart from each other. The portion 30 and the portion 31 may be physically disconnected from each other.

For example, the dielectric layer 14 in FIG. 1A may extend between two adjacent dielectric layers 12d and run over the transistors 11. In FIG. 3, the dielectric layer 14 is not extending between two adjacent dielectric layers 12d.

Figure 4A:
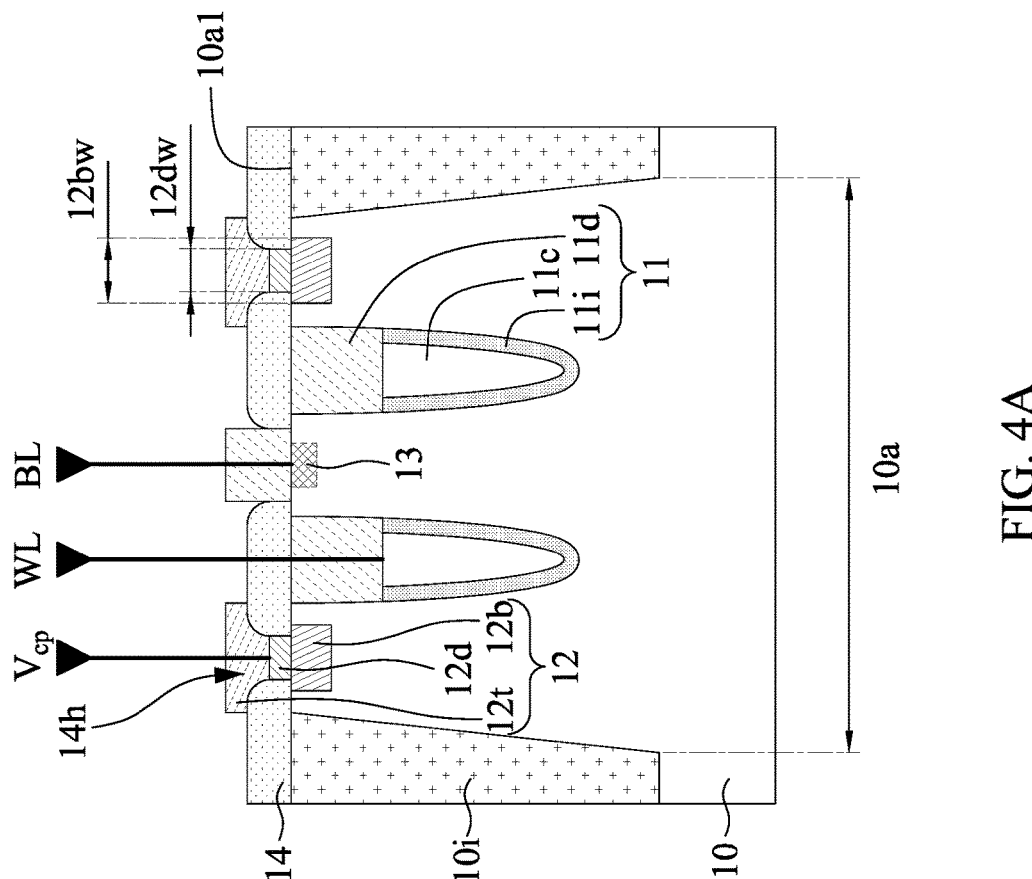
FIG. 4A is a schematic cross-sectional view of a semiconductor device in accordance with some embodiments of the present disclosure.
Figure 4B:
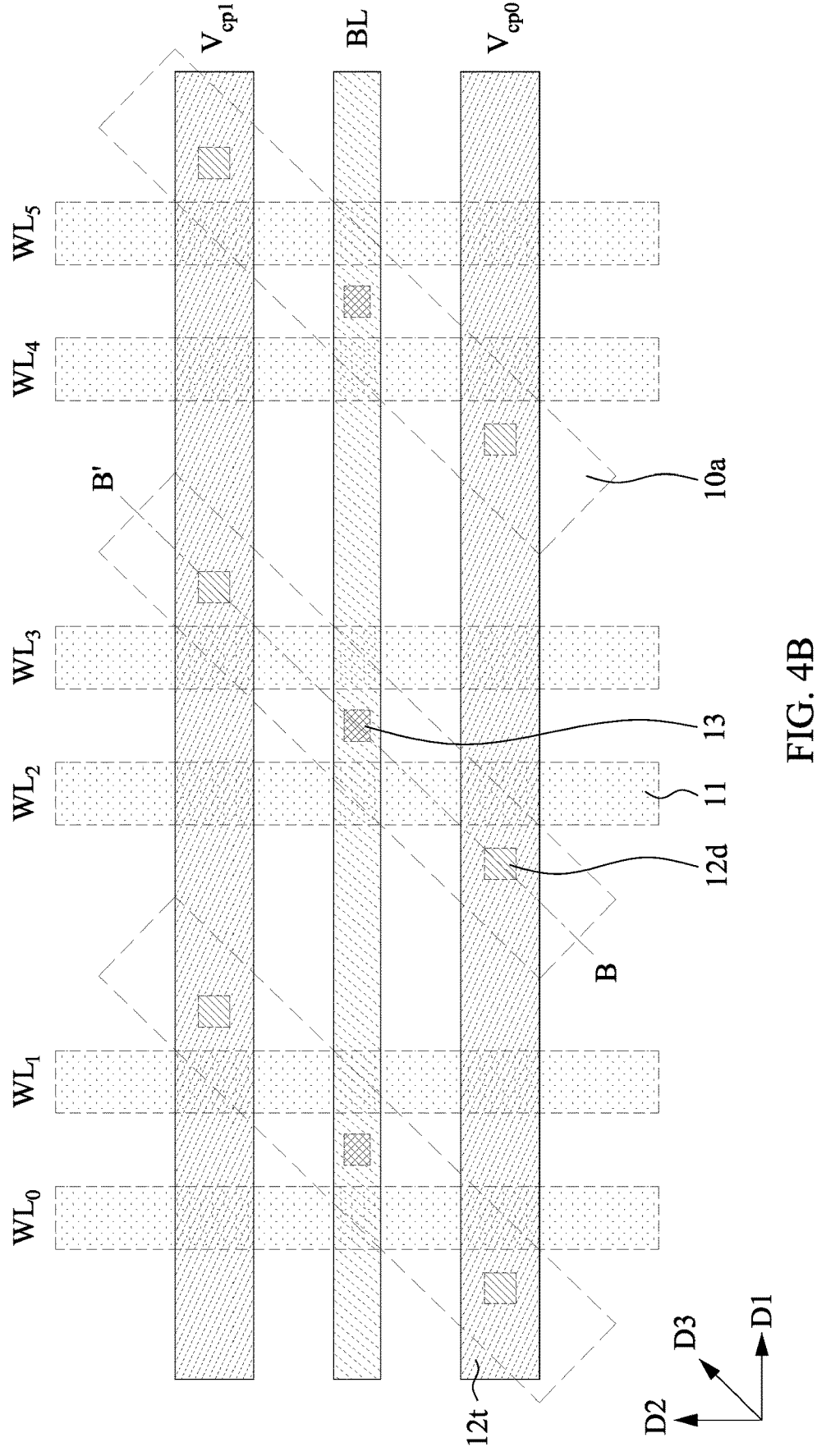
FIG. 4B is a schematic top view of a semiconductor device in accordance with some embodiments of the present disclosure.

FIG. 4A is a schematic cross-sectional view of a semiconductor device 4 in accordance with some embodiments of the present disclosure. FIG. 4B illustrates a schematic top view of a semiconductor device in accordance with some embodiments of the present disclosure. In some embodiments, the semiconductor device 4 of FIG. 4A may be a schematic cross-sectional view cutting through line BB' in FIG. 4B. The semiconductor device 4 is similar to the semiconductor device 1 of FIG. 1A, except for the differences described below.

As shown in FIG. 4B, the active areas 10a may each be formed as a strip-like configuration extending over the substrate (not shown in FIG. 4B, such as the substrate 10 in FIG. 1A) along a third direction, such as the direction D3 shown in FIG. 4B.

In some embodiments, the top electrodes 12t may each be intersected with the active areas 10a at an angle less than about 90 degrees. In some embodiments, the transistors 11 may each be intersected with the active areas 10a at an angle less than about 90 degrees.

The diffusion area 13 (which may include bit-line contacts) may be shared by two transistors 11.

FIGS. 5A, 5B, 5C, 5D, 5E, 5F, 5G, 5H, 5I and 5J illustrate stages of a method of manufacturing a semiconductor device in accordance with some embodiments of the present disclosure. At least some of these figures have been simplified for a better understanding of the aspects of the present disclosure. In some embodiments, the semiconductor device 1 in FIG. 1A may be manufactured by the operations described below with respect to FIGS. 5A, 5B, 5C, 5D, 5E, 5F, 5G, 5H, 5I and 5J.

Figure 5A:
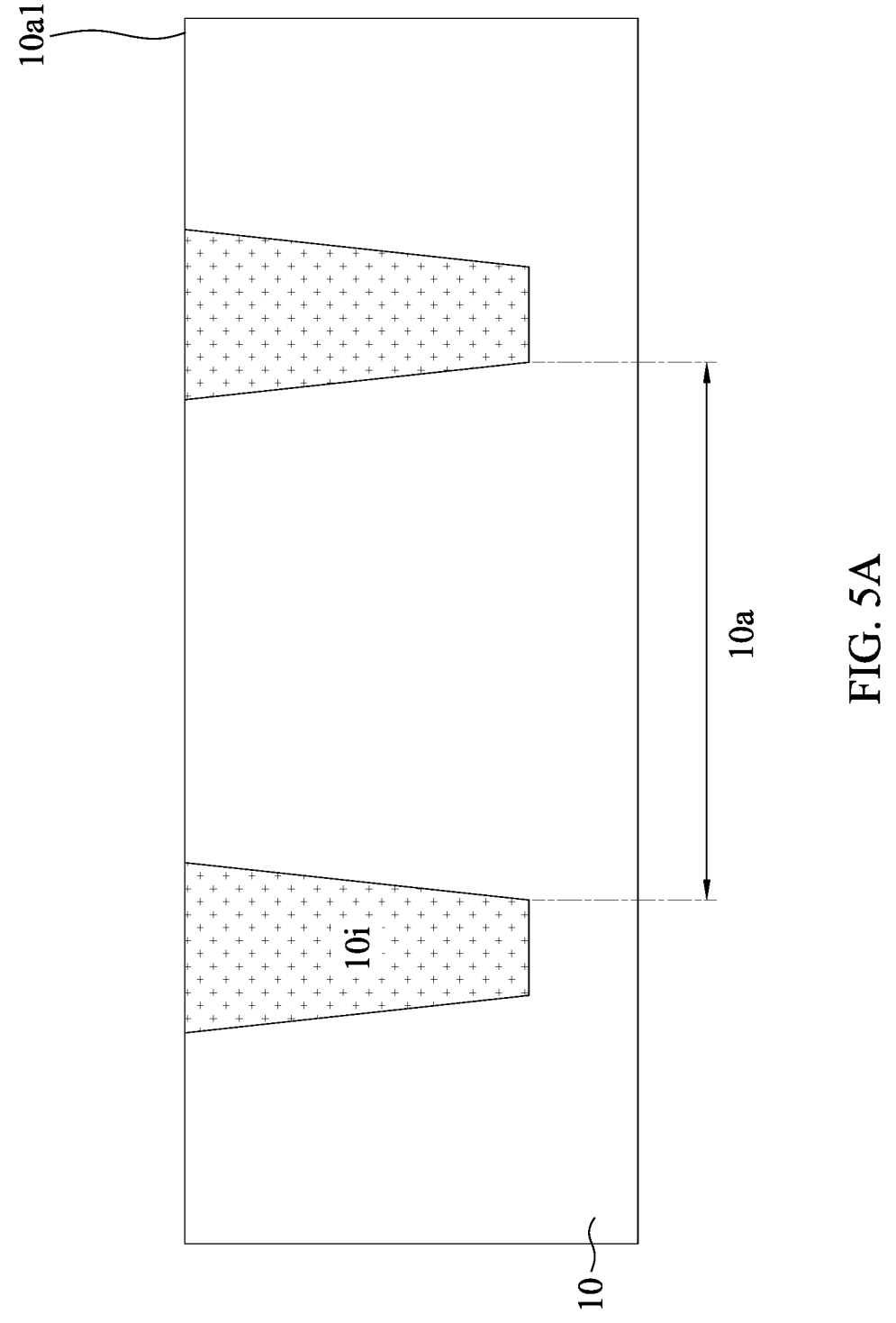
FIG. 5A illustrates one or more stages of a method of manufacturing a semiconductor device in accordance with some embodiments of the present disclosure.

Referring to FIG. 5A, the substrate 10 may be provided. The isolation structures 10i may be disposed over or in the substrate 10. The active area 10a may be defined by the isolation structures 10i. In some embodiments, the isolation structures 10i may be formed by trench etching followed by filling the trench with a dielectric material. In some embodiments, the active area 10a may be formed by doping impurities through ion-implantation or thermal diffusion. In some embodiments, the active area 10a may be formed over or proximal to the top surface of the substrate 10. In some embodiments, the active area 10a may be formed after the formation of the isolation structures 10i. In some other embodiments, the active area 10a may be formed before the formation of the isolation structures 10i.

Figure 5B:
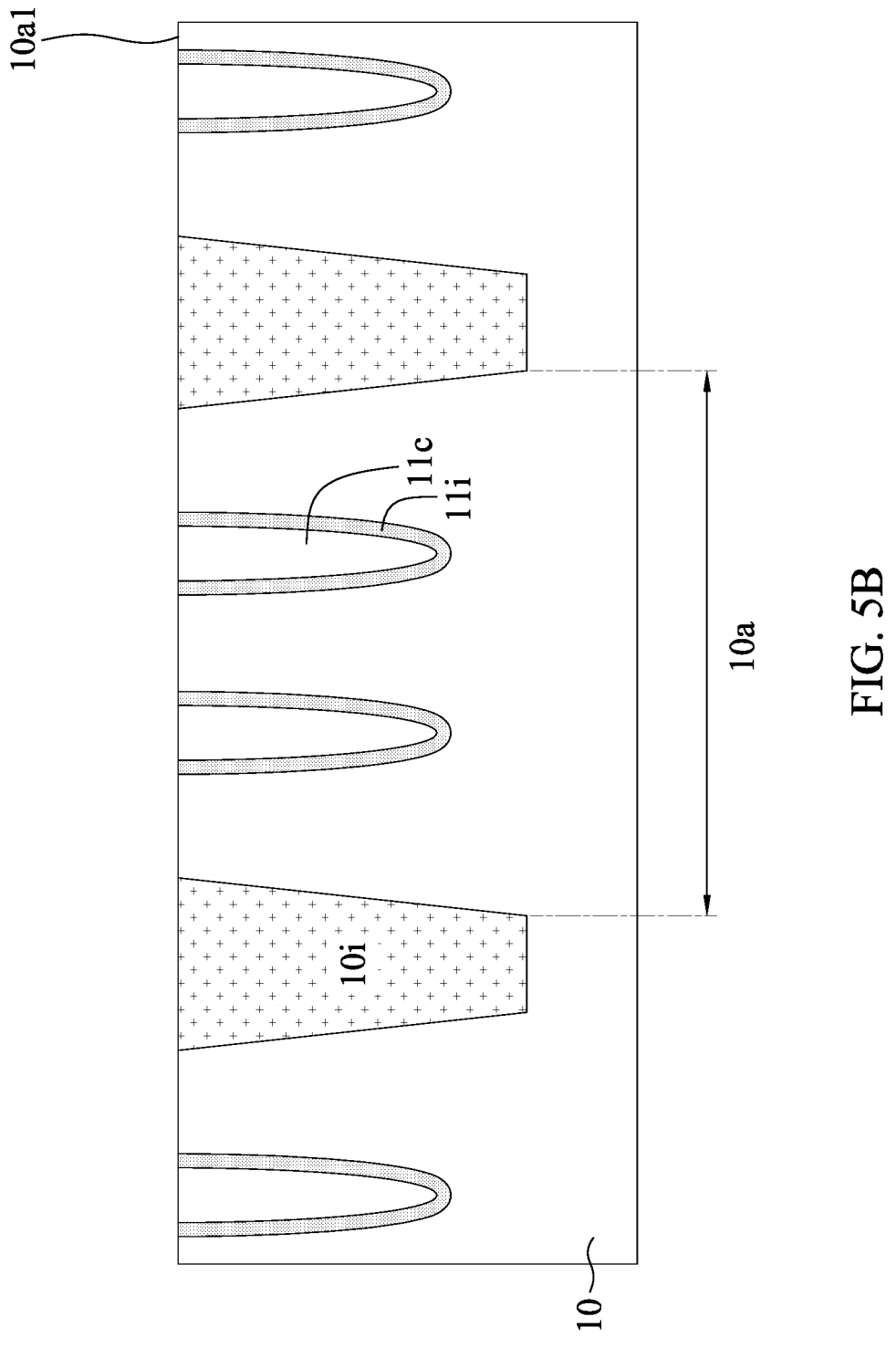
FIG. 5B illustrates one or more stages of a method of manufacturing a semiconductor device in accordance with some embodiments of the present disclosure.

Referring to FIG. 5B, the transistors 11 may be formed in the active area 10a. For example, trenches may be formed in the active area 10a. Each of the trenches may have a line shape crossing the active area 10a. In some embodiments, the trenches may be formed by lithography and etching techniques. For example, each of the trenches may be formed by an etch process of the substrate 10 using a hard mask layer as an etch mask. The hard mask layer may be formed on the substrate 10 and have line-shaped openings.

In some embodiments, the trenches may each have a depth shallower than that of the active area 10a. In some embodiments, the trenches may each have a depth shallower than that of the isolation structures 10i.

The insulating liners 11i may be formed in each of the trenches. Before the insulating liners 11i are formed, the inside surface of each of the trenches that is damaged from the etch process may be recovered. For example, sacrificial oxide may be formed by a thermal oxidation treatment, and then the sacrificial oxide may be removed.

The insulating liners 11i may be formed by a thermal oxidation process. In some embodiments, the insulating liners 11i may be formed by a deposition process, such as a chemical vapor deposition (CVD) process or an atomic layer deposition (ALD) process.

The conductors 11c may be formed on the insulating liner 11i to fill each of the trenches. The conductors 11c may be formed by a CVD process, ALD process, or a combination thereof.

Figure 5C:
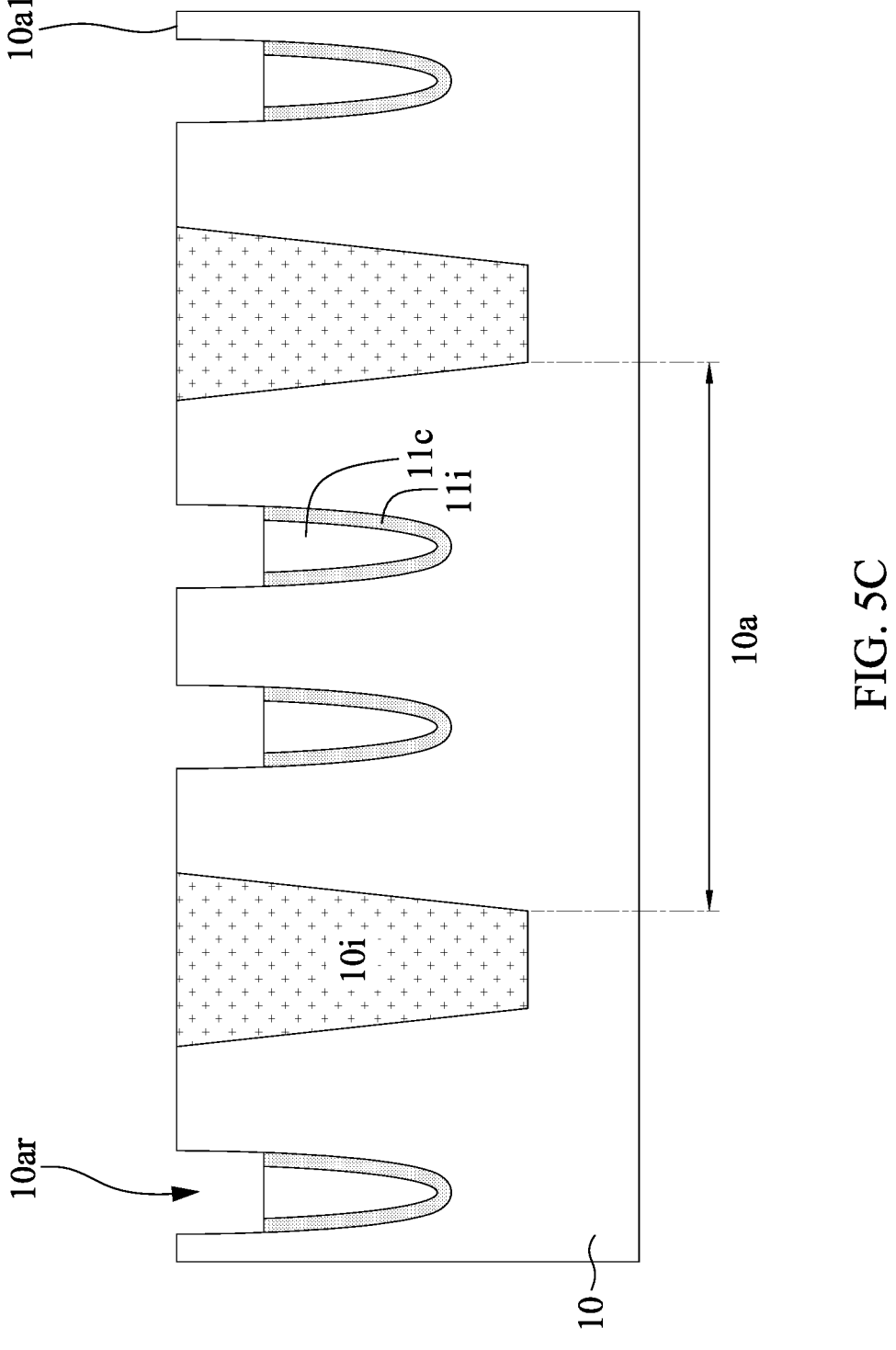
FIG. 5C illustrates one or more stages of a method of manufacturing a semiconductor device in accordance with some embodiments of the present disclosure.

Referring to FIG. 5C, a recessing process may be performed. The recessing process may be performed by a dry etch process, for example, an etch-back process. The recessing process may be performed to recess the conductors 11c (and also the insulating liner 11i) into the substrate 10.

In some embodiments, a planarization process may be performed in advance to expose the top surface of the substrate 10, and then the recessing process may be performed.

After the recessing process, a plurality of recess portions 10ar may be formed in the trenches.

Figure 5D:
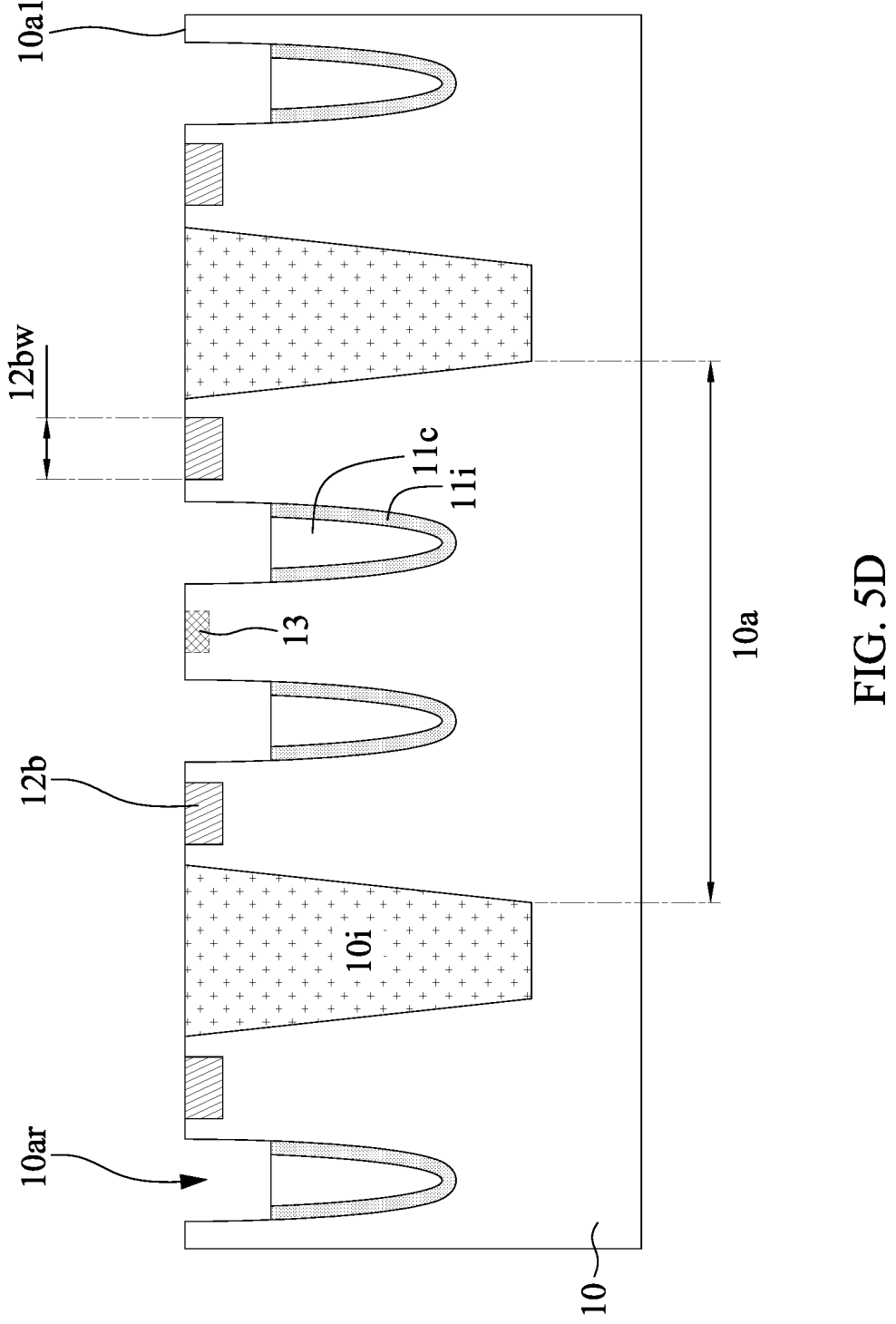
FIG. 5D illustrates one or more stages of a method of manufacturing a semiconductor device in accordance with some embodiments of the present disclosure.

Referring to FIG. 5D, the bottom electrode 12b and the diffusion area 13 are formed in the substrate 10. In some embodiments, the bottom electrode 12b and the diffusion area 13 may be formed by a chemical diffusion process or an ion implantation process.

Figure 5E:
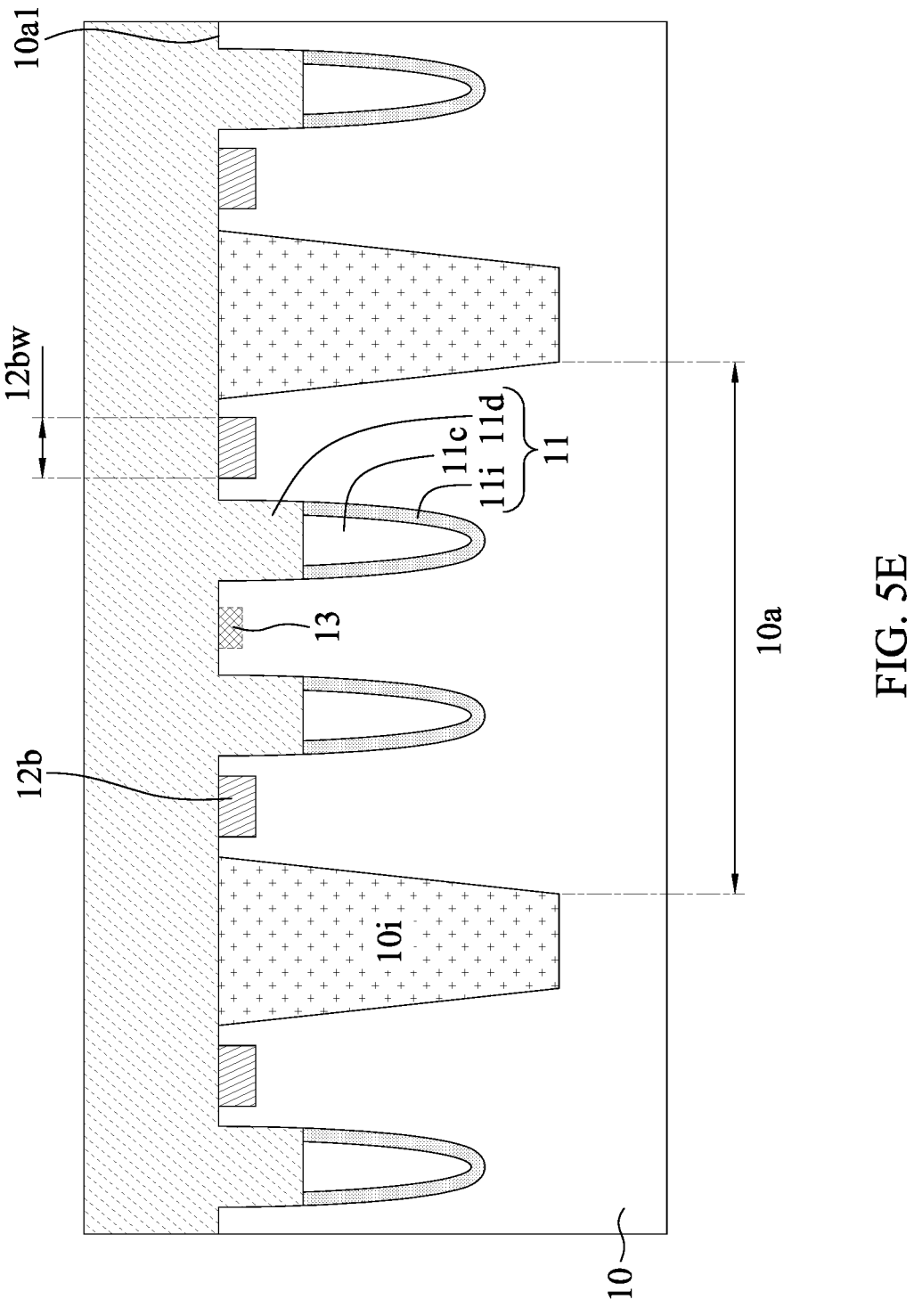
FIG. 5E illustrates one or more stages of a method of manufacturing a semiconductor device in accordance with some embodiments of the present disclosure.

Referring to FIG. 5E, the dielectric layer 11d may be formed on the conductors 11c. In some embodiments, the dielectric layer 11d may be disposed to cover the conductors 11c and portions of the substrate 10. In some embodiments, the dielectric layer 11d covers sidewalls of the substrate 10 that are exposed through the trenches. In some embodiments, the dielectric layer 11d may be disposed by, for example, an ALD process, a CVD process, a physical vapor deposition (PVD) process, a remote plasma CVD (RPCVD) process, a plasma enhanced CVD (PECVD) process, a coating process, etc.

Figure 5F:
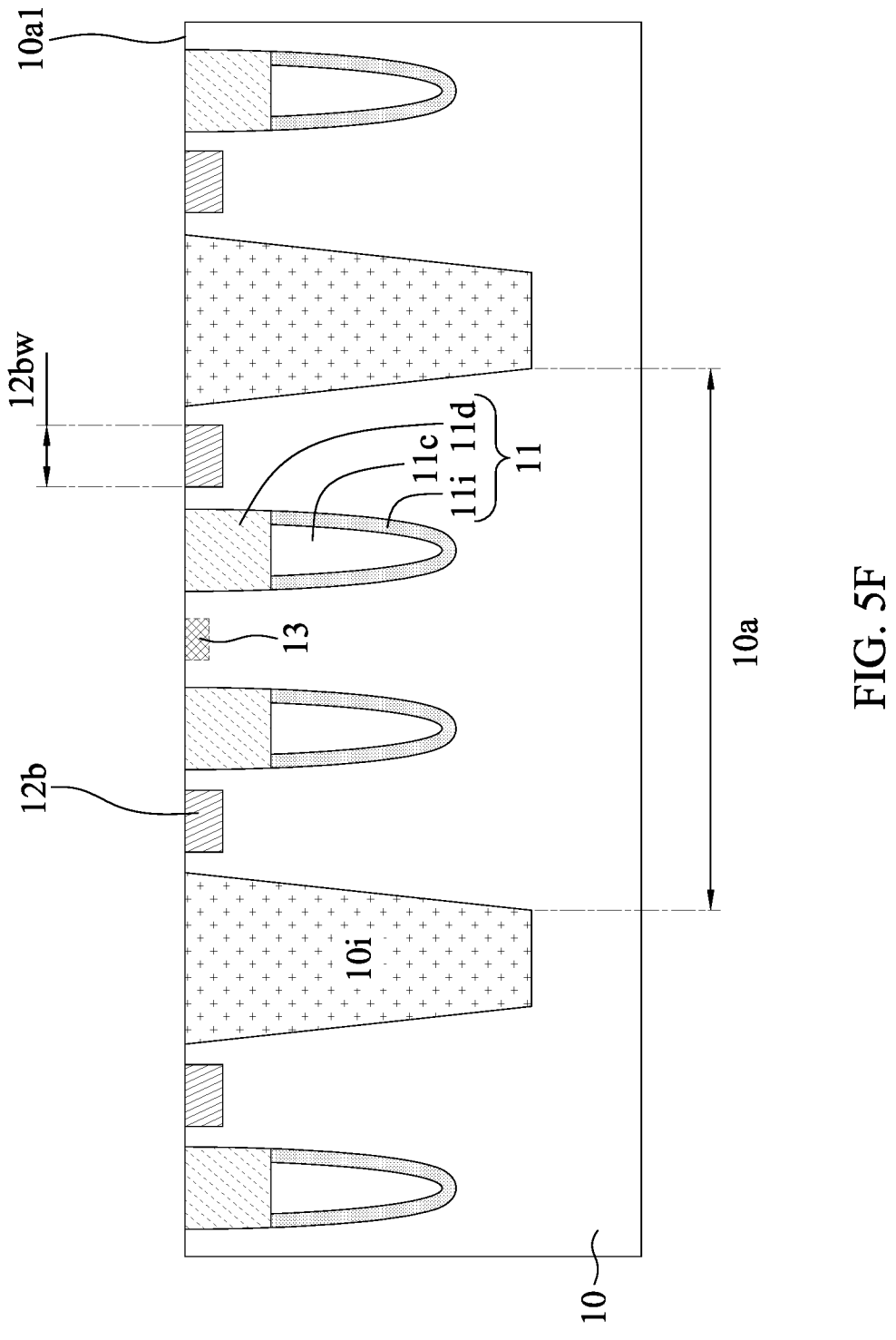
FIG. 5F illustrates one or more stages of a method of manufacturing a semiconductor device in accordance with some embodiments of the present disclosure.

Referring to FIG. 5F, the dielectric layer 11d may be planarized so that the top surface of the bottom electrode 12b is exposed.

Figure 5G:
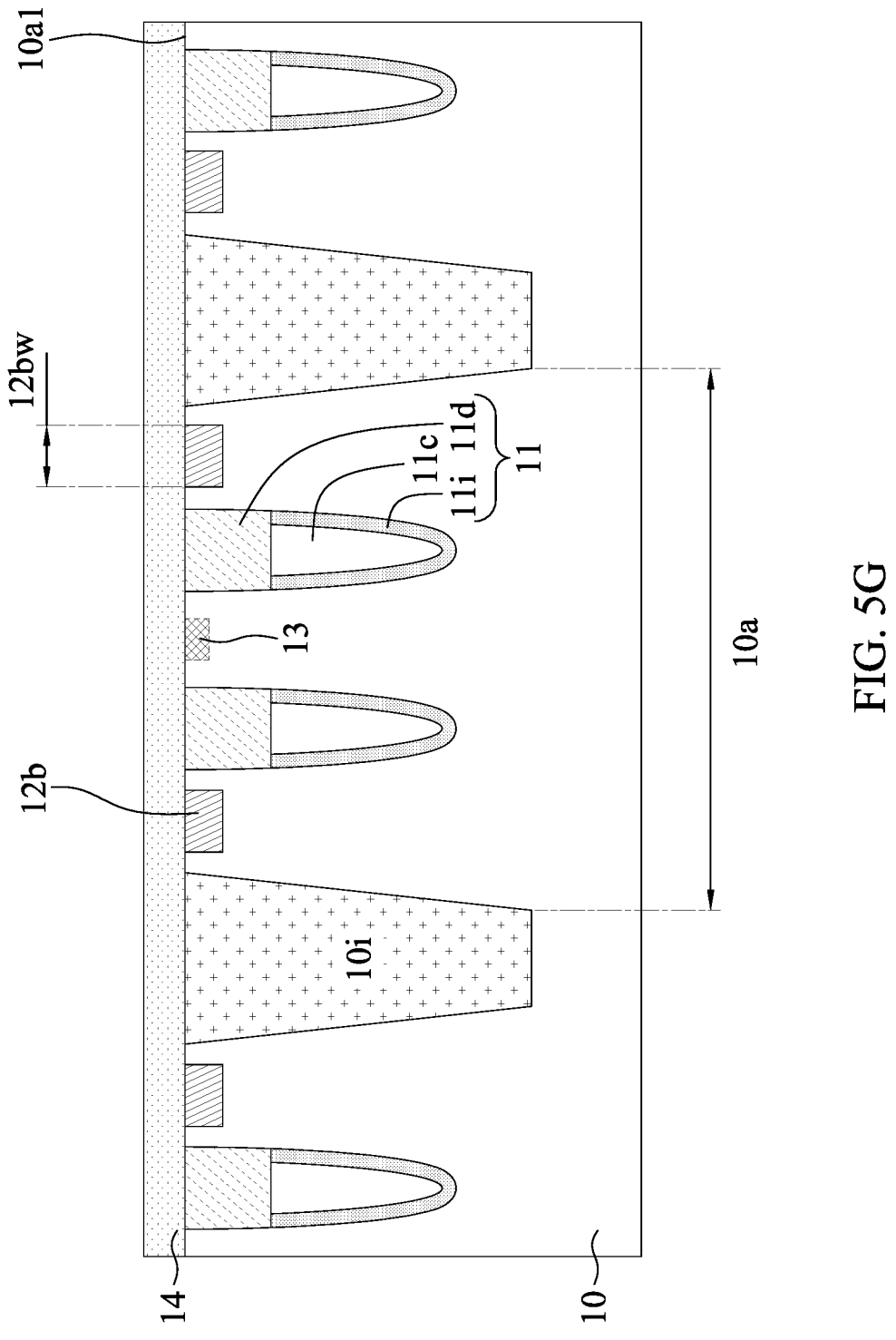
FIG. 5G illustrates one or more stages of a method of manufacturing a semiconductor device in accordance with some embodiments of the present disclosure.

Referring to FIG. 5G, the dielectric layer 14 may be disposed on the substrate 10. In some embodiments, the dielectric layer 14 may be disposed by, for example, an ALD process, a CVD process, a PVD process, a RPCVD process, a PECVD process, a coating process, etc.

Figure 5H:
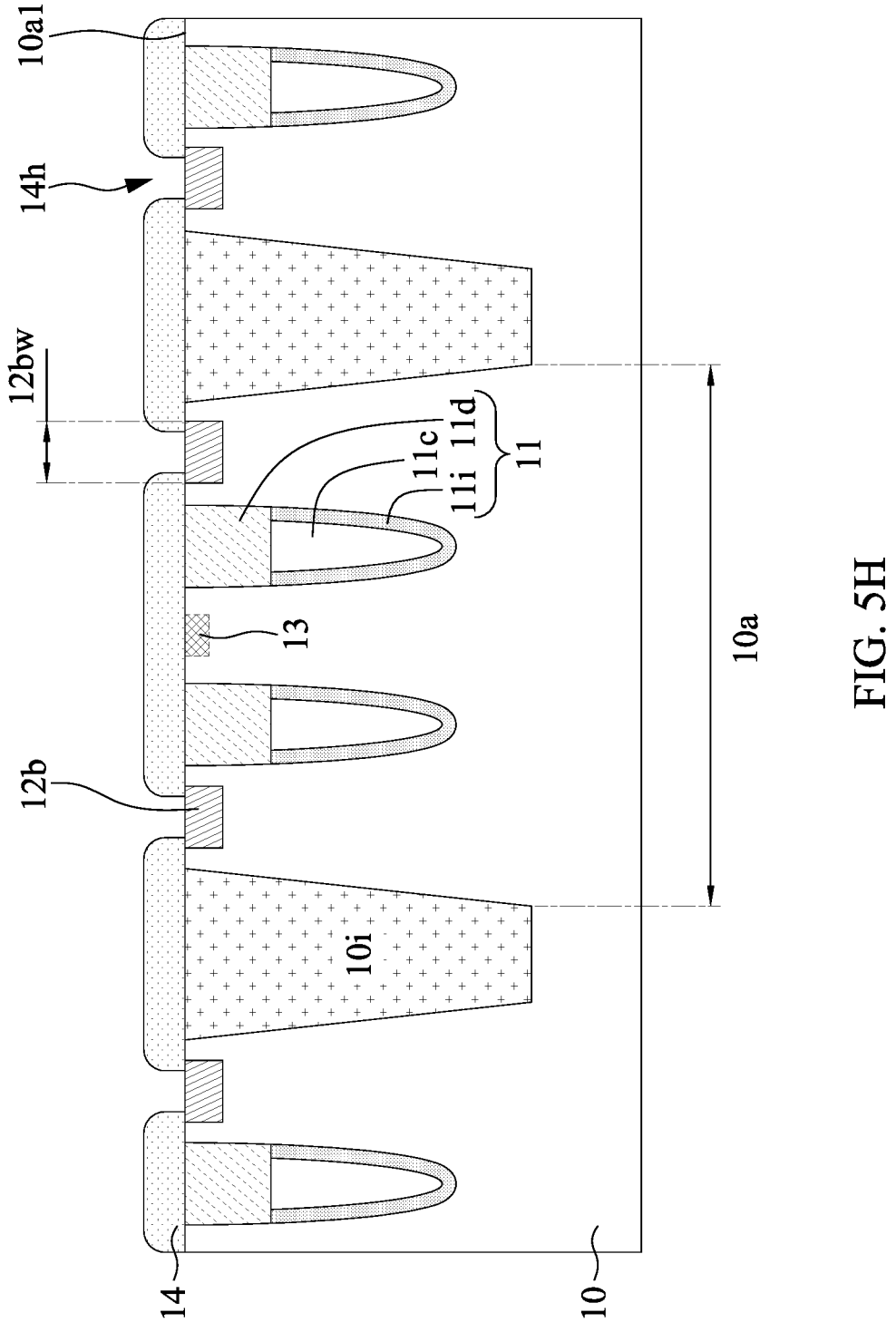
FIG. 5H illustrates one or more stages of a method of manufacturing a semiconductor device in accordance with some embodiments of the present disclosure.

Referring to FIG. 5H, openings 14h may be formed in the dielectric layer 14 by lithography and etching techniques. At least a part of each of the bottom electrode 12b may be exposed from the openings 14h.

Figure 5I:
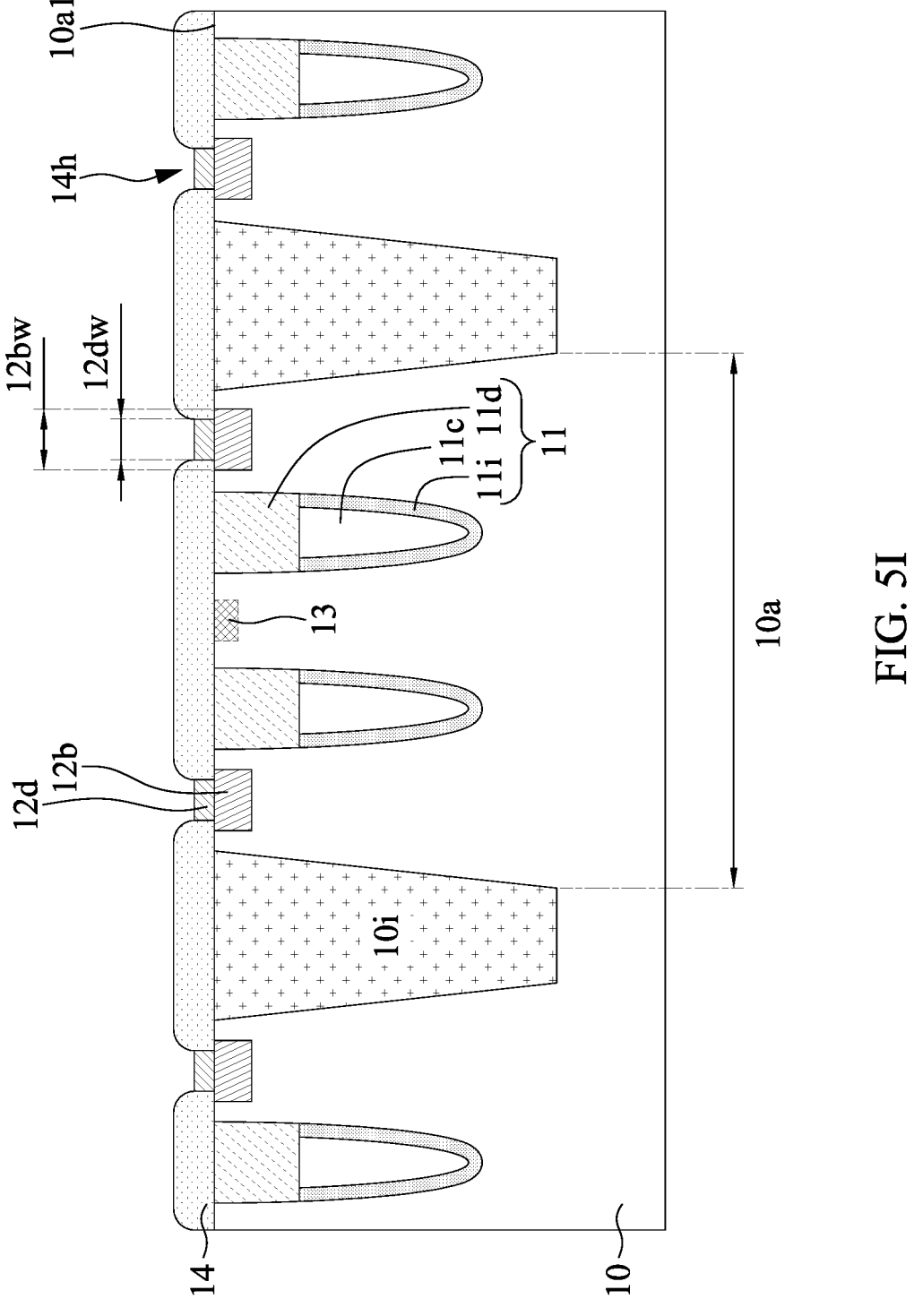
FIG. 5I illustrates one or more stages of a method of manufacturing a semiconductor device in accordance with some embodiments of the present disclosure.

Referring to FIG. 5I, the dielectric layers 12d may be disposed in the openings 14h. The dielectric layers 12d may contact at least a part of each of the bottom electrodes 12b.

In some embodiments, the fuse dielectric material may be formed by a thermal oxidation operation. In some embodiments, the fuse dielectric material may be formed by an ALD process, a CVD process, or a combination thereof.

Figure 5J:
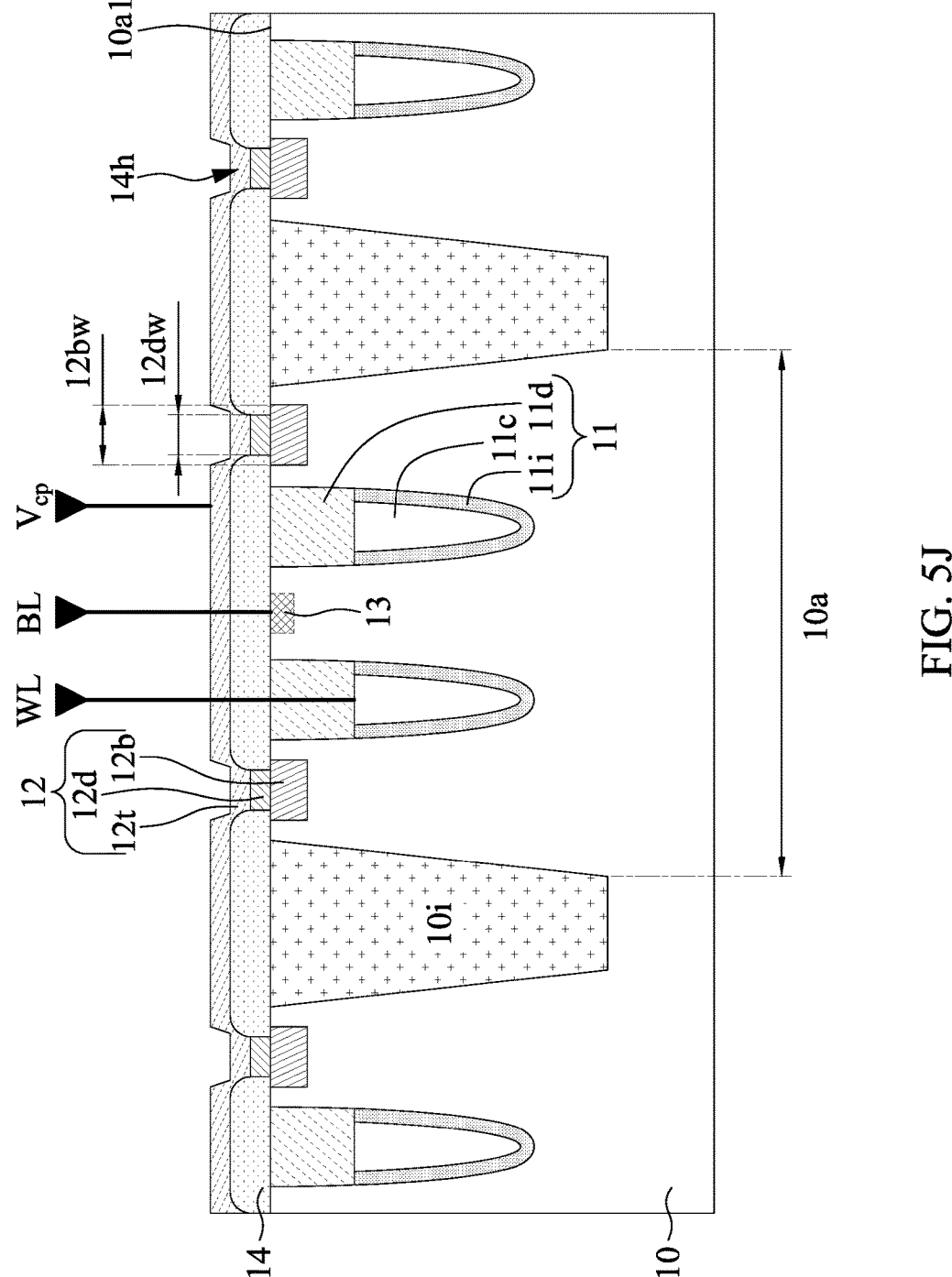
FIG. 5J illustrates one or more stages of a method of manufacturing a semiconductor device in accordance with some embodiments of the present disclosure.

Referring to FIG. 5J, the top electrode 12t may be formed on the dielectric layer 14. The top electrode 12t may be disposed in the openings 14h to contact the dielectric layers 12d.

In some embodiments, the top electrode 12t may be formed by a CVD process. In some embodiments, the top electrode 12t may be formed by depositing a blanket polysilicon layer on the dielectric layer 14 and then performing a patterning process to form strips spaced apart from one another by a given distance.

In some embodiments, subsequent to the formation of the fuse component 12, a wiring layer (not shown in the figures) may be formed on the fuse component 12. For example, the wiring layer may have a multilayer wiring structure which includes a plurality of wiring layers and interlayer insulating films.

In some embodiments, the method may further include connecting the top electrode 12*t* and the bottom electrode 12*b* to a power supply so as to apply a voltage to the top electrode 12*t* and the bottom electrode 12*b* to cause an open circuit in the semiconductor device to become a short circuit or a relatively low resistance link or node. For example, when a voltage applied to the top electrode 12*t* and the bottom electrode 12*b* exceeds a threshold value, the resistivity of the dielectric layer 12*d* may be changed. For example, the dielectric layer 12*d* may undergo a dielectric breakdown process.

In some embodiments, the operations described with respect to FIGS. 5A, 5B, 5C, 5D, 5E, 5F, 5G, 5H, 5I and 5J may be performed concurrently during a manufacturing process of, for example, a buried-gate structure of an adjacent circuit.

FIG. 6 illustrates a flow chart of a method 60 of manufacturing a semiconductor device in accordance with some embodiments of the present disclosure.

In some embodiments, the method 60 may include a step S61, providing a substrate having an active area. For example, as shown in FIG. 5A, the substrate 10 having the active area 10*a* disposed over or proximal to the top surface of the substrate 10 may be provided.

In some embodiments, the method 60 may include a step S62, forming a transistor in the active region. For example, as shown in FIG. 5B, the transistors 11 may be formed in the active area 10*a*.

In some embodiments, the method 60 may include a step S63, forming a first diffusion area in the active area. For example, as shown in FIG. 5D, the bottom electrode 12*b* may be formed in the active area 10*a*.

In some embodiments, the method 60 may include a step S64, forming a second diffusion area in the active area. For example, as shown in FIG. 5D, the diffusion area 13 may be formed in the active area 10*a*.

In some embodiments, the step S63 and the step S64 may be performed in the same operation. In some embodiments, the step S63 and the step S64 may be performed sequentially or in parallel.

In some embodiments, the method 60 may include a step S65, disposing a nitride layer on the active area. For example, as shown in FIG. 5G, the dielectric layer 14 may be disposed on the substrate 10.

In some embodiments, the method 60 may include a step S66, forming an opening in the nitride layer to expose the first diffusion area. For example, as shown in FIG. 5H, openings 14*h* may be formed in the dielectric layer 14 by lithography and etching techniques. At least a part of each of the bottom electrode 12*b* may be exposed from the openings 14*h*.

In some embodiments, the method 60 may include a step S67, disposing an oxide layer in the opening to contact the first diffusion area. For example, as shown in FIG. 5I, the dielectric layers 12*d* may be disposed in the openings 14*h*. The dielectric layers 12*d* may contact at least a part of each of the bottom electrodes 12*b*.

In some embodiments, the method 60 may include a step S68, disposing a polysilicon layer on the nitride layer to cover the oxide layer. For example, as shown in FIG. 5J, the top electrode 12*t* may be formed on the dielectric layer 14. The top electrode 12*t* may be disposed in the openings 14*h* to contact the dielectric layers 12*d*.

One aspect of the present disclosure provides a semiconductor device. The semiconductor device includes a substrate having an active area and a fuse component. The fuse component has a bottom electrode in the active area, a first dielectric layer on the active area and a top electrode on the first dielectric layer. The semiconductor device also includes a second dielectric layer on the active area and surrounding the first dielectric layer.

Another aspect of the present disclosure provides a semiconductor device. The semiconductor device includes a substrate having an active area and a first diffusion area adjacent to a surface of the active area. The semiconductor device also includes a nitride layer on the active area and defines a first fuse blown area above the first diffusion area.

Another aspect of the present disclosure provides a method of manufacturing a semiconductor device. The method includes providing a substrate having an active area and forming a first diffusion area in the active area. The method also includes disposing a nitride layer on the active area and forming an opening in the nitride layer to expose the first diffusion area. The method also includes disposing an oxide layer in the opening to contact the first diffusion area.

By using a nitride layer to define a fuse blown area, the oxide breakdown area of the fuse component of the present disclosure is reduced and the probability of successfully fusing the fuse components is increased. In addition, since the oxide breakdown location of the fuse component of the present disclosure is spaced apart from the transistor, the drain-gate (D-G) short probability is reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, comprising:

providing a substrate having an active area;

forming a fuse component having a bottom electrode in the active area, a first dielectric layer on the active area and a top electrode on the first dielectric layer; and forming a nitride layer on the active area and surrounding the first dielectric layer;

forming a transistor coupling a first voltage to the bottom electrode of the fuse component;

wherein a bottom surface of the nitride layer is in contact with a top surface of the bottom electrode of the fuse component;

wherein the bottom electrode of the fuse component is configured to receive the first voltage to change a resistivity of the first dielectric layer of the fuse component;

wherein the top electrode of the fuse component is 5 configured to receive a second voltage to change the resistivity of the first dielectric layer of the fuse component.

2. The method of claim 1, wherein forming the transistor comprises forming a buried conductor in the active area. 10

3. The method of claim 1, wherein forming the bottom electrode of the fuse component comprises forming a diffusion area adjacent to a surface of the active area.

4. The method of claim 1, wherein a width of the bottom electrode of the fuse component is greater than a width of the 15 first dielectric layer of the fuse component.

5. The method of claim 1, wherein forming the nitride layer comprises forming an opening and the bottom electrode of the fuse component is exposed from the opening.

6. The method of claim 1, wherein forming the top 20 electrode of the fuse component comprises forming a recessing portion over the first dielectric layer of the fuse component.

7. The method of claim 1, wherein the nitride layer includes silicon nitride ($Si_3N_4$). 25

8. The method of claim 1, wherein nitrides in the nitride layer and the dielectric layer are different.

\* \* \* \* \*